United States Patent
Bai et al.

(10) Patent No.: US 8,475,867 B2
(45) Date of Patent: Jul. 2, 2013

(54) METHOD FOR FORMING ELECTRICAL TRACES ON SUBSTRATE

(75) Inventors: Yao-Wen Bai, Shenzhen (CN); Cheng-Hsien Lin, Tayuan (TW)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 772 days.

(21) Appl. No.: 12/570,040

(22) Filed: Sep. 30, 2009

(65) Prior Publication Data

US 2010/0129532 A1      May 27, 2010

(30) Foreign Application Priority Data

Nov. 27, 2008  (CN) .......................... 2008 1 0305777

(51) Int. Cl.
*C23C 18/54* (2006.01)
*C23C 18/38* (2006.01)

(52) U.S. Cl.
USPC ....... 427/97.3; 427/97.9; 427/98.4; 427/99.5; 427/123; 106/1.23; 205/126

(58) Field of Classification Search
USPC .......................... 427/97.3; 106/1.23; 205/126
See application file for complete search history.

(56) References Cited

U.S. PATENT DOCUMENTS

| 4,023,984 | A  | * | 5/1977  | Clementson et al. ........... 134/38 |
| 4,935,267 | A  | * | 6/1990  | Kondo et al. ................. 427/97.3 |
| 6,022,596 | A  | * | 2/2000  | Baum et al. .................... 430/315 |
| 7,281,964 | B2 | * | 10/2007 | Ito et al. ......................... 445/24 |
| 2005/0006339 | A1 | * | 1/2005 | Mardilovich et al. ........... 216/39 |
| 2007/0074316 | A1 | * | 3/2007 | Alden et al. .................. 977/762 |
| 2007/0079727 | A1 | * | 4/2007 | Itabashi et al. ............... 106/1.23 |

FOREIGN PATENT DOCUMENTS

TW          200636027 A     10/2006
TW          200812729 A     3/2008

OTHER PUBLICATIONS

Sun et al "Synthesis of Uniform Silver Nanowires". Chem. Maer. vol. 14,No. 11 2002 pp. 4736-4745.*
BASF company PVP Brochure, found at http://www.luvitec.com/portal/load/fid332993/BASF%20-%20PVP%20and%20more_2009_Brochure.pdf.*

* cited by examiner

*Primary Examiner* — Dah-Wei Yuan
*Assistant Examiner* — Jose Hernandez-Diaz
(74) *Attorney, Agent, or Firm* — Altis Law Group, Inc.

(57) ABSTRACT

A method for forming electrical traces on a substrate includes the steps of: providing a substrate; printing an ink pattern using an ink on the substrate, the ink including a aqueous medium containing silver ions and a heat sensitive reducing agent; heating the ink pattern to reduce silver ions into silver particles thereby forming an semi-finished traces; and forming a metal overcoat on the semi-finished traces by electroless plating thereby obtaining patterned electrical traces.

13 Claims, 4 Drawing Sheets

METHOD FOR FORMING ELECTRICAL TRACES ON SUBSTRATE

CROSS-REFERENCE TO RELATED APPLICATIONS

This application is related to commonly-assigned copending applications application Ser. No. 12/235,994, entitled "METHOD OF FORMING CIRCUITS ON CIRCUIT BOARD", application Ser. No. 12/253,869, entitled "PRINTED CIRCUIT BOARD AND METHOD FOR MANUFACTURING SAME", and application Ser. No. 12/327,621, entitled "INK AND METHOD OF FORMING ELECTRICAL TRACES USING THE SAME". Disclosures of the above-identified applications are incorporated herein by reference.

BACKGROUND

1. Technical Field

The present disclosure relates generally to method for manufacturing printed circuit boards (PCBs), and particularly, to a method for forming electrical traces on a printed circuit board substrate using printing technology.

2. Description of Related Art

New ink jet circuit printing is an exciting new technology for creating the ultra-tiny microcircuits of PCBs that enable computers and personal electronic devices to get smaller and smaller each year. In a typical ink jet circuit printing method, an ink is printed onto a specified area of an insulated substrate, for example, a polyethylene terephthalate (PET) layer, using an ink jet printer, and thereby an ink pattern is formed on the insulated substrate. The ink contains silver nano-particles and solvents that keep the particles in a colloidal suspension. Then the ink pattern is sintered to remove the solvents, by a heating process at 200 to 300 degrees Celsius (° C.). After the solvents are removed, electrical traces are formed in the specified area of the insulated substrate. However, in the typical ink jet circuit printing method, the silver nano-particles in the electrical traces have loose contact with each other, and accordingly, the electrical traces has poor electrical conductivity. In addition, commonly used insulated substrates for PCBs are comprised of polymer such as PET, which has low heat resistance. Thus, even at 200 to 300° C., the insulated substrate may starts to soften and possibly deform, and the quality of the insulated substrate and the electrical traces may be compromised.

What is needed, therefore, is a method for forming electrical traces on a substrate which can overcome the aforementioned problems.

BRIEF DESCRIPTION OF THE DRAWINGS

Many aspects of the present method for forming electrical traces on a substrate can be better understood with references to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

A method for forming electrical traces on a substrate using a silver ions containing ink will be described in detail with reference to accompanying figures.

The method includes the steps of:

(1) printing an ink pattern on the substrate using an ink, the ink comprising an aqueous medium containing silver ions and a heat sensitive reducing agent, the heat sensitive reducing agent being capable of reacting with the silver ions at a temperature in the range from approximately 50° C. to approximately 250° C.;

(2) heating the ink pattern to reduce silver ions into silver particles thereby forming semi-finished traces on the substrate; and (3) forming a metal overcoat on the semi-finished traces by electroless plating thereby obtaining patterned electrical traces on the substrate.

Figure 1:
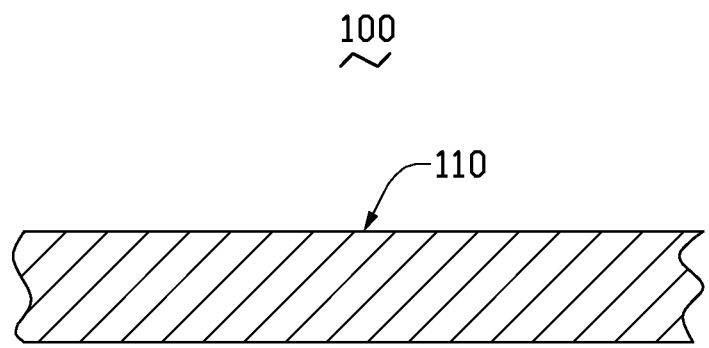
FIG. 1 is a cross-sectional view of part of an exemplary substrate used in the method of FIG. 1.

In step (1), referring to FIG. 1, a substrate 100 is provided firstly. The substrate 100 is made with materials suitable for carrying printed circuits, such as polyimide (PI), PET, polyethylene naphthalate (PEN), and others. The substrate 100 has a surface 110. The surface 110 can be cleaned prior to performing the remaining steps of the method. For example, the substrate 100 can be ultrasonically processed in a mixture of acetone, tert-butyl alcohol, and deionized water for 5 to 15 minutes, and then dried.

Figure 2:
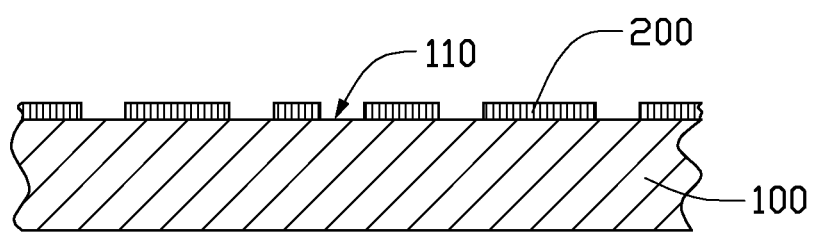
FIG. 2 is similar to FIG. 1, but showing an ink pattern printed on a surface of the substrate.

Secondly, referring to FIG. 2, an ink pattern 200 comprised of an ink is printed on the surface 110 of the substrate 100 using an ink jet printing technology by an ink jet printer. The ink pattern 200 includes a plurality of ink lines, which distributed on predetermined areas of the surface 110. In the present embodiment, an Epson™ R 230 ink jet printer equipped with special disc tray is employed to print the ink pattern 200. Limited by the Epson™ R 230 ink jet printer, the minimum line width of the ink pattern 200 is 0.1 mm. However, it is understood that the minimum line width can be further decreased by employing high resolution ink jet printers.

The ink includes water, a water-soluble silver salt, a heat sensitive reducing agent, and a water-soluble organic solvent. The water-soluble silver salt, the heat sensitive reducing agent, and the water-soluble organic solvent are uniformly dissolved in the ink, respectively, thereby forming a aqueous medium containing silver ions, in which the silver ions, the heat sensitive reducing agent, and the water-soluble organic solvent are uniformly dissolved and distributed. The water-soluble silver salt is selected from the group consisting of silver nitrate, silver sulfate, silver acetate, and silver citrate. The molar concentration of the water-soluble silver salt in the ink is in the range from approximately 0.02 mol/L to approximately 2 mol/L. The heat sensitive reducing agent is capable of reacting with the water-soluble silver salt at a temperature in the range from approximately 50° C. to approximately 250° C. Examples of the heat sensitive reducing agent include polyvinylalcohol (PVA) or polyvinylpyrrolidone (PVP), or any other suitable water-soluble resin. The weight percent of the heat sensitive reducing agent in the ink is in the range from approximately 0.1% to 2%. The water-solution organic solvent can be water-soluble alcohols such as methyl alcohol, ethyl alcohol, 1,2-propylene glycol, n-propyl alcohol, iso-propyl alcohol, n-butyl alcohol, sec-butyl alcohol, t-butyl alcohol, iso-butyl alcohol, furfuryl alcohol, and tetrahydrofurfuryl alcohol, or can be water-soluble ether such as methyl ether, ethyl ether, and ethylene glycol monobutyl ether. The weight percent of the water-soluble organic solvent in the ink is in the range from approximately 4% to approximately 50%. The weight percent of water in the ink is in the range from approximately 20% to approximately 95%. In addition, a surfactant and an adhesive agent also can be added into the ink. The surfactant can be alkyl imidazoline amphoteric surfactant series, and the adhesive agent can be methyl cellulose (MC), for example.

Figure 3:
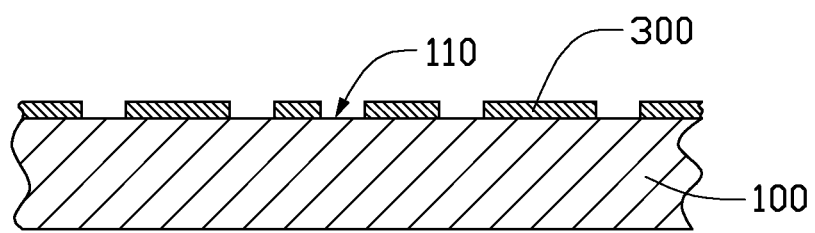
FIG. 3 is similar to FIG. 2, but showing the ink pattern transformed into an semi-finished traces.

In step (2), referring to FIGS. 2 and 3, the ink pattern 200 is heated to reduce the silver ions into silver particles, and the silver particles form a semi-finished traces 300 with a patterned shape defined by the ink pattern 200. In other words, the silver ions react with the heat sensitive reducing agent in the heating process and the silver particles are reaction products of the reduction. The silver particles are distributed on the predetermined area of the surface 110 regularly and evenly, whereby the semi-finished traces 300 correspondingly have a uniform width and thickness. However, the silver particles may be spaced with each other in microscopic detail, and the semi-finished traces 300 may have an impact structure and a relatively weak electrical conductivity. Average particle size of the silver particles as measured by a scanning electron microscope (SEM) is approximately in the range from 60 nanometers (nm) to 300 nm. In other embodiments, the average particle size of the silver particles can be of any suitable scale, such as nanoscale (e.g., 1 nm to 999 nm) or microscale (e.g., 1 micrometer to 100 micrometers).

The ink pattern 200 can be heated in an oven. Generally, a heating temperature of the heating step is less than the glass transition temperature (Tg) of the substrate 100. In the present embodiment, the heating temperature is in the range from approximately 50° C. to approximately 250° C. to avoid damage to the substrate 100. In another embodiment, the heating temperature is in the range from approximately 50° C. to approximately 100° C. A heating time of this heating step can last for more than 3 minutes. After this heating step, the substrate 100 with the semi-finished traces 300 formed thereon is brought out of the oven, washed with water, and then dried.

Optionally, the substrate 100 with the semi-finished traces 300 formed thereon can be dried at approximately 65° C. after the heating step. The drying process effectively evaporates other liquid solvents of the ink (e.g., water, the water-soluble organic solvent, and any other reaction product of the silver salt and the heat sensitive reducing agent), with only the solid silver particles remained/adhered thereon.

Figure 4:
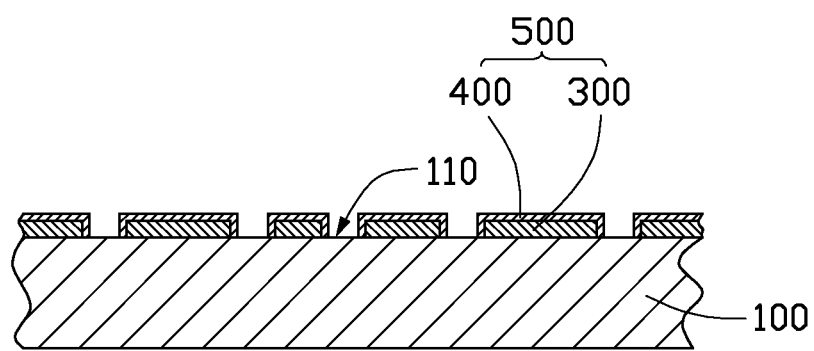
FIG. 4 is similar to FIG. 3, but showing the structure of the substrate after a metal overcoat has been plated on the semi-finished traces thereby obtaining patterned electrical traces.

In step (3), referring to FIG. 4, a metal overcoat 400 is plated on the semi-finished traces 300 via an electroless plating process, thereby forming patterned electrical traces 500 with a patterned shape defined by the semi-finished traces 300. The metal overcoat 400 improves the electrical conductivity of the semi-finished traces 300, thus that the patterned electrical traces 500 have high electrical conductivity and reliability.

In the electroless plating process, each of the silver particles in the semi-finished traces 300 is a reaction center, and metal atoms reduced from an electroless plating solution encapsulates each of the silver particles and are deposited therearound. Spaces (interstices) between adjacent silver particles are entirely filled with the metal atoms. Thereby, the silver particles of the semi-finished traces 300 are electrically connected by the metal atoms, thus providing the electrical traces 500 with good electrical conductivity.

The metal overcoat 400 can be comprised of copper, nickel, or silver. In the present embodiment, a material of the metal overcoat 400 is copper, and the electroless plating solution used to form the metal overcoat 400 includes water, copper sulfate, formaldehyde, potassium sodium tartrate, and ethylenediaminetetraacetic acid (EDTA). The substrate 100 with the semi-finished traces 300 formed thereon is dipped into the electroless plating solution at approximately 50° C. for approximately 1.5 minutes. Copper ions in the electroless plating solution are reduced into copper particles, with an average particle size from about 50 nm to about 150 nm. Typically, the copper particles also form a continuous overlayer of copper on the silver particles, such that the patterned electrical traces 500 have smooth copper top surfaces.

In order to test performance of the ink of different compositions, inks having composition as listed in table 1 are prepared, and then used to form patterned electrical traces on a polyimide substrate using the method as discussed above. The test results of electrical traces made from these inks are recorded in table 2.

TABLE 1 composition of inks

| Examples | Water (wt. %) | 1,2-propylene glycol (wt. %) | Ethylene glycol monobutyl ether (wt. %) | Silver nitrate (mol/L) | PVP (wt. %) | Heating time (min) |
|---|---|---|---|---|---|---|
| Example 1 | 73 | 25 | 2 | 0.01 | 0 | 15 |
| Example 2 | 70 | 25 | 5 | 0.01 | 0 | 15 |
| Example 3 | 69.5 | 20 | 10 | 0.02 | 0.5 | 15 |
| Example 4 | 69.5 | 15 | 15 | 0.02 | 0.5 | 15 |
| Example 5 | 69.67 | 16.7 | 13.3 | 0.17 | 0.33 | 15 |
| Example 6 | 69.5 | 15 | 15 | 0.17 | 0.5 | 15 |
| Example 7 | 69.5 | 16.7 | 13.3 | 0.17 | 0.5 | 15 |
| Example 8 | 69.33 | 16.7 | 13.3 | 0.17 | 0.67 | 15 |
| Example 9 | 69.17 | 16.7 | 13.3 | 0.17 | 0.83 | 15 |
| Example 10 | 68 | 16.7 | 13.3 | 0.17 | 2 | 15 |

TABLE 2

Test results of patterned electrical traces made from inks listed in table 1

| Examples | Eletroless plating ability | Continuity of ink pattern | Line width of electrical traces (mm) |
|---|---|---|---|
| Example 1 | Almost no metal overcoat is plated on the ink pattern | discontinuous | 0.13 |
| Example 2 | Almost no metal overcoat is plated on the ink pattern | discontinuous | 0.14 |
| Example 3 | OK | discontinuous | 0.1 |
| Example 4 | OK | discontinuous | 0.11 |

TABLE 2-continued

Test results of patterned electrical traces made from inks listed in table 1

| Examples | Eletroless plating ability | Continuity of ink pattern | Line width of electrical traces (mm) |
|---|---|---|---|
| Example 5 | OK | continuous | 0.11 |
| Example 6 | OK | continuous | 0.11 |
| Example 7 | OK | continuous | 0.12 |
| Example 8 | OK | continuous | 0.1 |
| Example 9 | OK | continuous | 0.1 |
| Example 10 | OK | discontinuous | 0.09 |

As shown in Table 2, concentrations of organic solvents (e.g., ethylene glycol monobutyl ether), PVP, and silver nitrite are key factors effecting quality of finally obtained patterned electrical traces. If the concentration of the organic solvents is less than 13.3% by weight, the wettability of the ink on the surface of the polyimide substrate is relatively bad, thereby causing the ink pattern on the surface transformed into droplets. As a result, the patterned electrical traces are discontinuous. With increasing concentration of the heat sensitive reducing agent (e.g., PVP), silver particles can more easily adhere to the surface of the polyimide substrate. However, if the concentration of the heat sensitive reducing agent is greater than approximately 2% by weight, the heat sensitive reducing agent will envelope the silver particles, and the silver particles cannot serve as a catalyst of the electroless plating reaction in this condition. Thus, the continuity of obtained electrical traces also fails to meet the requirements. An appropriate concentration of the heat sensitive reducing agent is in a range from approximately 0.5% to approximately 0.87% by weight.

TABLE 3

Test results of electrical traces made from inks having the composition of Example 5 and heated for different periods.

| Examples | Heating time (min) | Eletroless plating ability | Continuity of ink pattern | Line width of ink pattern (mm) |
|---|---|---|---|---|
| Example 11 | 5 | Almost no metal overcoat is plated on the ink pattern | discontinuous | 0.15 |
| Example 12 | 10 | OK | continuous | 0.11 |
| Example 13 | 15 | OK | continuous | 0.1 |
| Example 14 | 20 | OK | continuous | 0.12 |
| Example 15 | 30 | OK | continuous | 0.11 |

As shown in Table 3, the heating time should be longer than 3 minutes. The longer the heating time is, the more silver ions are reduced into silver particles. In the continuing process, the silver particles serve as catalyst of the electroless plating reaction. In this consideration, it is better to heat the ink pattern for a long period of time. However, performance of polyimide also deteriorates under the heating. Therefore, the heating time should be limited to a certain range (e.g., 3 minutes to 30 minutes), which is capable of producing adequate silver particles.

In other embodiments, prior to the ink pattern being formed, the polyimide substrate is submerged in a solution of potassium hydroxide in water at a concentration of 3 mol/L for approximately 30 seconds, and then electrical traces are printed using the ink having the composition as Example 8. Test results show that obtained patterned electrical traces have good continuity, and the line width of electrical traces increases to 0.15 mm (the printed ink pattern is still printed at a line width of 0.1 mm). This is because the potassium hydroxide treatment improves a wettability of the silver ions containing ink on the surface of the polyimide substrate. In addition, the obtained patterned electrical traces have a better adhesion to the polyimide substrate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

The invention claimed is:

1. A method for forming electrical traces on a substrate, the method comprising:
    printing an ink pattern on the substrate using an ink, the ink comprising an aqueous medium containing silver ions and a heat sensitive reducing agent, the heat sensitive reducing agent being capable of reacting with the silver ions at a temperature in the range from approximately 50° C. to approximately 250° C., the aqueous medium comprising water, a water-soluble silver salt, and a water-soluble organic solvent, the weight percent of the water-soluble organic solvent being in the range from 4%-50%, the molar concentration of the silver salt being in the range from 0.02 mol/L-2 mol/L, and the weight percent of the heat sensitive reducing agent being in the range from approximately 0.5% to approximately 0.87%;
    heating the ink pattern to reduce silver ions into silver particles thereby forming semi-finished traces on the substrate; and
    forming a metal overcoat on the semi-finished traces by electroless plating thereby obtaining patterned electrical traces on the substrate.

2. The method of claim 1, wherein the substrate is treated with a solution containing potassium hydroxide and water, prior to the step of printing the ink pattern.

3. The method of claim 1, wherein the substrate is ultrasonically processed in a mixture of acetone, tert-butyl alcohol, and deionized water for 5 to 15 minutes prior to the step of printing the ink pattern.

4. The method of claim 1, wherein the heat sensitive reducing agent is one of polyvinylalcohol and polyvinylpyrrolidone, and a combination thereof.

5. The method of claim 1, wherein the water soluble-silver salt is selected from the group consisting of silver nitrate, silver sulfate, silver acetate, and silver citrate.

6. The method of claim 5, wherein the aqueous medium further comprises a surfactant.

7. The method of claim 5, wherein the aqueous medium further comprises an adhesive agent, and the adhesive agent is methyl cellulose.

8. The method of claim 1, wherein the ink pattern is heated for about 3 minutes to about 30 minutes.

9. The method of claim 1, wherein a heating temperature in the heating step is in the range from approximately 50° C. to approximately 100° C.

10. The method of claim 1, wherein the substrate with the semi-finished traces formed thereon is dried at 60° C.-70° C. after the heating step.

11. The method of claim 1, wherein the material of the metal overcoat is copper.

12. The method of claim 11, wherein the substrate formed with the semi-finished traces is dipped into an electroless plating solution in the electroless plating step, and the electroless plating solution contains copper sulfate, potassium sodium tartrate, ethylene diamine tetraacetic acid disodium salt, formaldehyde and methanol.

13. The method of claim 1, wherein the material of the metal overcoat is nickel or silver.

* * * * *